(12) United States Patent
Yamamoto et al.

(10) Patent No.: US 11,754,617 B2
(45) Date of Patent: Sep. 12, 2023

(54) PRINTED CIRCUIT BOARD

(71) Applicant: TANAZAWA HAKKOSHA CO., LTD., Higashiosaka (JP)

(72) Inventors: Keiichiro Yamamoto, Higashiosaka (JP); Kazuo Tani, Higashiosaka (JP); Masaharu Yano, Higashiosaka (JP)

(73) Assignee: TANAZAWA HAKKOSHA CO., LTD., Higashiosaka (JP)

( * ) Notice: Subject to any disclaimer, the term of this patent is extended or adjusted under 35 U.S.C. 154(b) by 119 days.

(21) Appl. No.: 17/432,864

(22) PCT Filed: Jan. 24, 2020

(86) PCT No.: PCT/JP2020/002443
§ 371 (c)(1),
(2) Date: Aug. 20, 2021

(87) PCT Pub. No.: WO2020/170712
PCT Pub. Date: Aug. 27, 2020

(65) Prior Publication Data
US 2022/0091178 A1 Mar. 24, 2022

(30) Foreign Application Priority Data
Feb. 22, 2019 (JP) .................. 2019-030445

(51) Int. Cl.
*G01R 31/28* (2006.01)
*G06F 30/39* (2020.01)
(Continued)

(52) U.S. Cl.
CPC ....... *G01R 31/281* (2013.01); *G01R 1/07328* (2013.01); *G06F 30/39* (2020.01); *H05K 3/1225* (2013.01); *H05K 3/34* (2013.01)

(58) Field of Classification Search
CPC ............. G01R 31/281; G01R 1/07328; G01R 31/2812; G06F 30/39; H05K 3/1225;
(Continued)

(56) References Cited

U.S. PATENT DOCUMENTS

2019/0023960 A1* 1/2019 Chen .................. B32B 15/092

FOREIGN PATENT DOCUMENTS

JP          S6392265 U    6/1988
JP          H11150346 A   6/1999
(Continued)

*Primary Examiner* — Farhana A Hoque
(74) *Attorney, Agent, or Firm* — Rabin & Berdo, P.C.

(57) ABSTRACT

It is an object of the present invention to provide a printed circuit board capable of accurately detecting disconnections of circuit patterns with an automatic circuit pattern inspecting device even when positions of mounting lands are slightly deviated from normal positions due to manufacturing errors.
For solving this object, the printed circuit board of the present invention is provided with a first mounting land 4a and a second mounting land 4b, and a first circuit pattern 6a and a second circuit pattern 6b on a surface thereof, wherein a first electric checker land 10a and a second checker land 10b which are electrically connected with the first mounting land 4a and the second mounting land 4b are provided on a surface of a wiring board 2.

12 Claims, 6 Drawing Sheets

(51) Int. Cl.
*G01R 1/073* (2006.01)
*H05K 3/12* (2006.01)
*H05K 3/34* (2006.01)

(58) Field of Classification Search
CPC ........ H05K 3/34; H05K 1/111; H05K 3/3442; H05K 2201/10636; H05K 1/0268
USPC .................................................. 324/763.01
See application file for complete search history.

(56) References Cited

FOREIGN PATENT DOCUMENTS

| | | | |
|---|---|---|---|
| JP | 2007194462 | A | 8/2007 |
| JP | 6067135 | B1 | 1/2017 |

\* cited by examiner

PRINTED CIRCUIT BOARD

TECHNICAL FIELD

The present invention relates to a printed circuit board, and specifically to a printed circuit board onto which a small sized chip part of a size standard of so called "0603" that is smaller than "1005" is mounted.

BACKGROUND ART

In recent years, customer needs for downsizing chip parts are increasing, and size demands of chip parts have been growing currently from "1005 (L: 1.0 mm×W: 0.5 mm) to, for instance, "0603 (L: 0.6 mm×W: 0.3 mm).

FIG. 5 is a plan view showing a general design standard of a printed wiring board 40 mounted with a chip part having a size standard of "0603". The "0603" chip part 100 is surface mounted on a pair of mounting land patterns (hereinafter simply referred to as "mounting lands") 42a and 42b. The shape of the mounting lands 42a and 42b are a square of 0.3 mm square or a circle with a diameter of 0.3 mm, and have a distance of 0.3 mm between the mounting lands.

A solder resist film 44 for protecting the mounting lands 42a and 42b from, for instance, short circuiting are formed such that its deviation tolerance is ±0.15 mm (that is, resist clearances 45a and 45b are within 0.15 mm) with respect to the mounting lands 42a and 42b.

Patterns of the mounting lands 42a and 42b are formed, for instance, such that they are disposed to be within ±0.05 mm to 0.15 mm from design positions. The mounting lands 42a and 42b and the solder resist film 44 are formed by such as screen printing.

Contact probes 46a and 46b of an automatic circuit pattern inspecting device for detecting circuit pattern disconnection preferably contact (pressure contact) central portions of the mounting lands 42a and 42b, respectively.

In order to form such mounting lands requiring high accurate forming positions on a surface of a printed wiring board, various screen printing techniques have conventionally been suggested (see, for instance, Patent Literature 1).

CITATION LIST

Patent Literature

Patent Literature 1: Japanese Patent No. 6067135

SUMMARY OF THE INVENTION

Technical Problem

However, since only to apply various conventional screen printing techniques causes manufacturing errors, a problem can easily occur that positions of the mounting lands 42a and 42b are slightly deviate from their normal positions. This caused the problem that the contact probes 46a and 46b could not contact normally on the mounting lands 42a and 42b, respectively.

Moreover, there was the danger that indentations were formed on the surfaces of the mounting lands 42a and 42b due to pressure contact force of the contact probes 46a and 46b on the surfaces of the mounting lands 42a and 42b to cause surface mounting failures of the chip part 100.

Accordingly, the main object of the present invention is to provide a printed circuit board capable of accurately detecting disconnections of circuit patterns with the automatic circuit pattern inspecting device even when positions of the mounting lands are slightly deviated from normal positions due to manufacturing errors.

Means for Solving the Problem

As a result of earnest investigations, the present inventors found a solution for the above problem by the following invention and reached the present invention.

That is, as explained above, when the positions of the mounting lands slightly deviate from their normal positions due to manufacturing errors, the contact probes will be out of areas of the mounting lands, so that accurate disconnection inspections cannot be performed. Therefore, the inventors of the present invention have found a solution of the problem by obtaining an empty area for providing electric checker lands having large areas adjacent to the mounting lands apart from the mounting lands, and by making the contact probes contact the electric checker lands instead of the mounting lands.

The printed circuit board according to the present invention
is a printed circuit board formed with mounting lands and circuit patterns on a surface thereof,
wherein electric checker lands electrically connected with the mounting lands are formed on the surface of a wiring board.

The printed circuit board according to the present invention is for mounting a chip part whose size standard is less than "1005" on the mounting lands.

In the printed circuit board according to the present invention, it is preferable that the size of the mounting lands is less than 0.5 mm and that the size of the electric checker lands is 0.5 mm or more.

In the printed circuit board according to the present invention, it is preferable that a solder resist film is formed on the surface of the printed wiring board except for the mounting lands and peripheral portions thereof, and the electric checker lands and peripheral portions thereof.

In the printed circuit board according to the present invention, it is preferable that a resist clearance between the mounting lands and the solder resist film is 0.15 mm or more.

In the printed circuit board according to the present invention, it is preferable that a ck resist cut between adjacent to mounting lands and electric checker lands is 0.15 mm.

In the printed circuit board according to the present invention, it is preferable that the length of circuit patterns connecting the mounting lands with the electric checker lands is 0.45 mm or more.

In the printed circuit board according to the present invention, it is preferable that the electric checker lands extend towards outside of the chip part.

In the wiring board according to the present invention, it is preferable that the shape of the electric checker lands is circular or rectangular.

Advantageous Effects of Invention

According to the present invention, it is possible to obtain a wiring board capable of accurately detecting disconnections of circuit patterns by the automatic circuit pattern inspecting device even when positions of the mounting lands are slightly deviated from normal positions due to manufacturing errors.

The above mentioned object, other objects, features and advantages of the present invention will become more apparent from the following descriptions of examples made with reference to the drawings.

BRIEF DESCRIPTION OF THE DRAWINGS

FIG. 2A is a cross sectional view along line IIA-IIA of FIG. 1. FIG. 2B is a cross-sectional view along line IIB-IIB of FIG. 1.

FIG. 2C is an end view along line IIC-IIC of FIG. 1. FIG. 2D is an end view along line IID-IID of FIG. 1.

FIG. 4B is an end view along line IIIB-IIIB of FIG. 4A.

FIG. 4C is a cross-sectional view along line IIIC-IIIC of FIG. 4A.

FIG. 4D is a cross-sectional view of along line IIID-IIID FIG. 4A.

DESCRIPTION OF THE EMBODIMENTS

1. Structure of the Printed Circuit Board

Example 1

The first example of the printed circuit board according to the present invention will now be described.

Figure 1:
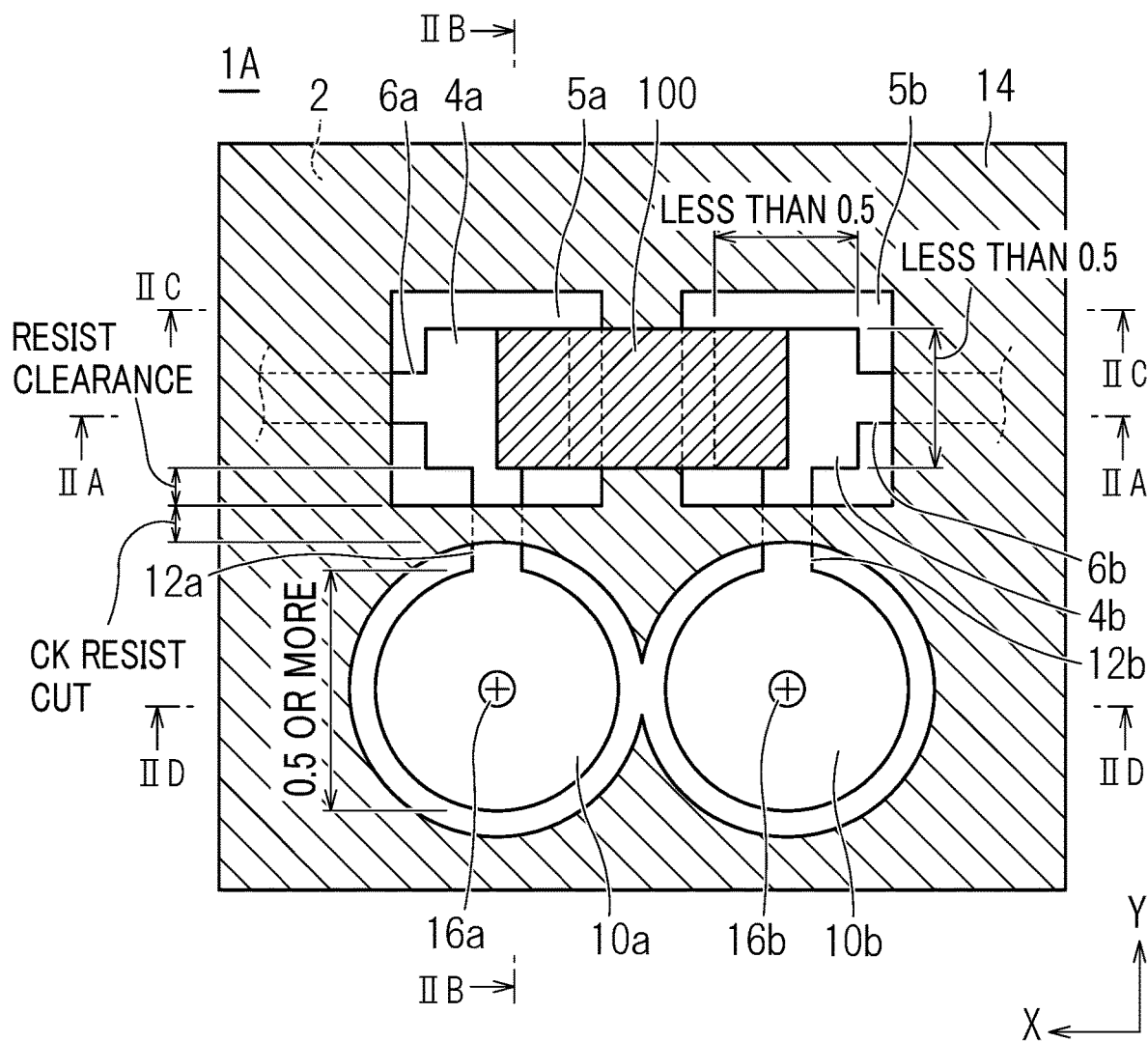
FIG. 1 is a plan view showing a first example of the printed circuit board according to the present invention.
Figure 2A:
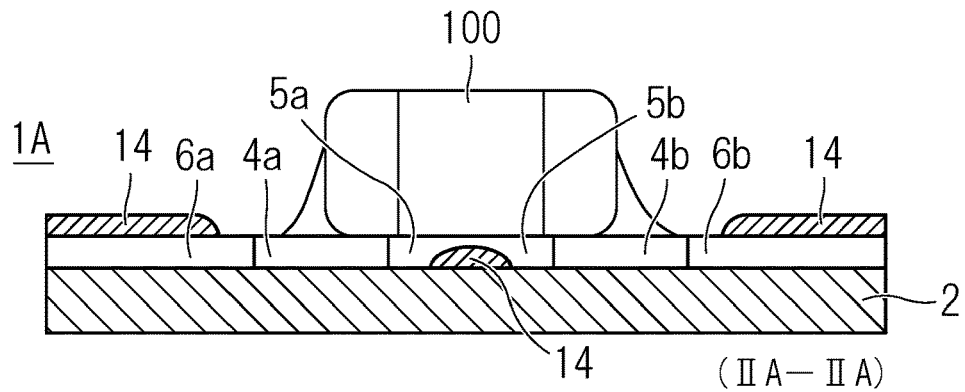
FIGS. 2A to 2D are cross sectional views of FIG. 1.
Figure 2B:
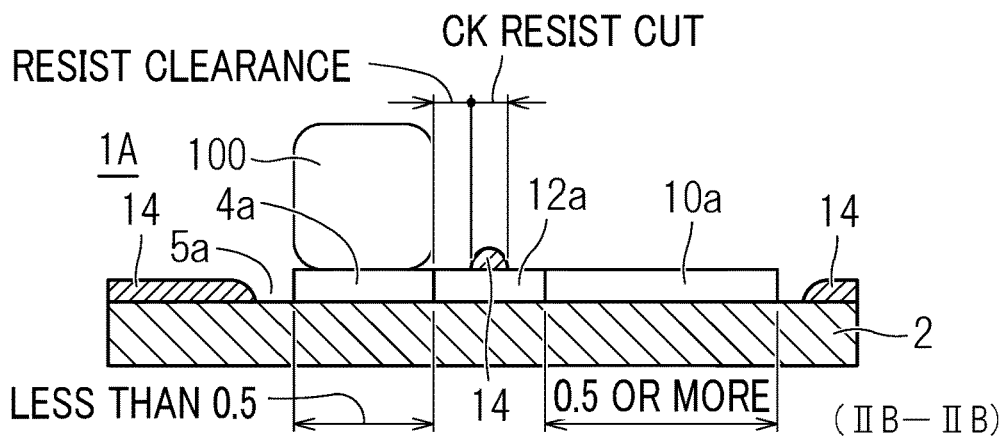
Figure 2C:
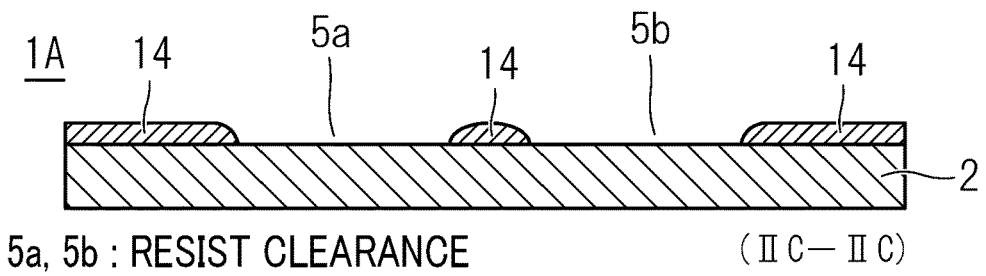
Figure 2D:
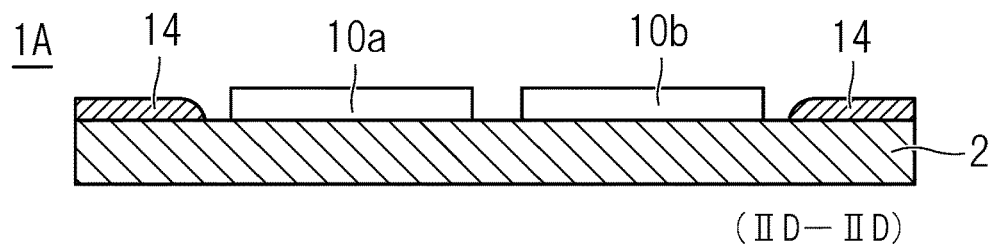

FIG. 1 is a plan view showing a first example of the printed circuit board according to the present invention.

In the present invention, as shown in FIG. 1, in a printed circuit board 1A, a direction x is defined as a direction that a pair of a first mounting land 4a and a second mounting land 4b face each other. A direction y is defined as a direction orthogonal to the direction x. In other words, in this example, the direction x is a length direction of the chip part 100 of "0603 size" that is surface mounted by soldering a pair of external electrodes of the chip part 100 (not shown in figures) on the first mounting land 4a and the second mounting land 4b respectively, and the direction y is a width direction thereof (the same applies to the second example).

However, the dimension of the chip part 100 is not particularly limited when its size standard is less than "1005".

As shown in FIG. 1, the printed circuit board 1A is arranged in that the first mounting land 4a and the second mounting land 4b, a first circuit pattern 6a and a second circuit pattern 6b, a first electric checker land 10a and a second electric checker land 10b, a first lead out pattern 12a and a second lead out pattern 12b, and a solder resist film 14 are provided on a surface of a printed wiring board 2.

The printed wiring board 2 is formed, for instance, of a resin with insulating properties having a thickness of 0.1 mm or more and 1.0 mm or less. The printed wiring board 2 is comprised, for instance, of a glass cloth base epoxy resin laminate, a paper base phenol board, a paper epoxy board, a glass composite board, a Teflon (registered trademark) board, an alumina board, or a polyimide board.

The first mounting land 4a and the second mounting land 4b are square or circular in a plan view including portions that are electrically connected with the chip part 100. The size of the mounting lands is less than 0.5 mm.

In this example, the first mounting land 4a and the second mounting land 4b have a size of less than 0.5 mm square (more specifically 0.3 mm square) when the lands are square in a plan view, or the diameter of the lands is less than 0.5 mm (more specifically 0.3 mm) when the lands are circular in a plan view because the size standard of the chip part 100 mounted is "size 0603" and small.

Patterns of the first mounting land 4a and the second mounting land 4b are disposed such that printing deviations are, for instance, within ±0.05 mm to 0.15 mm of the design positions.

"mm (millimeter) square" denotes a length (in millimeters) of one side of a square land.

A land diameter is a diameter of a circular land.

The first mounting land 4a and the second mounting land 4b are disposed in parallel at an appropriate interval.

The solder resist film 14 to be described later is formed between the first mounting land 4a and the second mounting land 4b. A resist clearance 5a is formed between the solder resist film 14 and the first mounting land 4a so as to enclose the first mounting land 4a, and a resist clearance 5b is formed between the solder resist film 14 and the second mounting land 4b so as to enclose the second mounting land 4b.

The size of the electric checker lands is 0.5 mm or more.

In this example, the first electric checker land 10a and the second electric checker land 10b are formed to be circular in a plan view. Further, both of the first electric checker land 10a and the second electric checker land 10b are formed such that at least their diameter is 0.5 mm or more so that their areas are larger than those of the first mounting land 4a and the second mounting land 4b. Since patterns of the first electric checker land 10a and the second electric checker land 10b are formed simultaneously with the patterns of the first mounting land 4a and the second mounting land 4b, printing deviations from design positions occur in the same direction and by the same amount as the first mounting land 4a and the second mounting land 4b. Accordingly, respective design positions of the patterns of the first electric checker land 10a and the second electric checker land 10b are disposed such that they are within ±0.05 mm to 0.15 mm of the design values.

The first mounting land 4a and the second mounting land 4b, and the first electric checker land 10a and the second electric checker land 10b are comprised of a metal such as Cu, Au, Pd, or Pt or alloys thereof. The thicknesses of the first mounting land 4a and the second mounting land 4b, and the first electric checker land 10a and the second electric checker land 10b are 18 μm or more and 70 μm or less. The first mounting land 4a and the second mounting land 4b, and the first electric checker land 10a and the second electric checker land 10b are formed by etching a metal layer formed on the surface of the printed wiring board 2. The first mounting land 4a and the second mounting land 4b comprise a land portion for mounting an electronic part (chip part 100).

The first mounting land 4a and the first electric checker land 10a are electrically connected and the second mounting land 4b and the second electric checker land 10b are electrically connected.

The solder resist film 14 for protecting the first mounting land 4a and the second mounting land 4b, and the first electric checker land 10a and the second electric checker land 10b, among others, from, for instance, short circuiting is formed with respect to the first mounting land 4a and the second mounting land 4b, among others, to have a deviation tolerance of, for instance, ±0.15 mm (that is, the resist clearances 5a and 5b are, for instance, within 0.15 mm).

The first lead out pattern 12a for electrically connecting the first mounting land 4a with the first electric checker land 10a extends in the direction y towards the outside of the chip part 100. Similarly, the second lead out pattern 12b for electrically connecting the second mounting land 4b with the second electric checker land 10b extends in the direction y towards the outside of the chip part 100.

The length of the first lead out pattern 12a and the second lead out pattern 12b is 0.45 mm or more and 0.6 mm or less based on cumulative results of manufacturing errors upon considering two patterns of manufacturing errors as shown in Table 1 below. Here, "ck resist cut" mentioned in the table indicates a width of the solder resist film 14 disposed between the first mounting land 4a and the second mounting land 4b, and the first electric checker land 10a and the second electric checker land 10b.

TABLE 1

| ck Resist Cut | Resist Clearance | Print Deviation | Length of Lead-out Pattern |
| --- | --- | --- | --- |
| 0.15 mm | 0.15 mm | 0.15 mm | 0.45 mm |
| 0.2 mm | 0.2 mm | 0.2 mm | 0.6 mm |

The length of the first lead out pattern 12a for connecting the first mounting land 4a with the first electric checker land 10a is 0.45 mm or more, and the length of the second lead out pattern 12b for connecting the second mounting land 4b with the second electric checker land 10b is 0.45 mm or more.

Due to the above structures, in the printed circuit board 1A shown in FIG. 1, the first electric checker land 10a and the second electric checker land 10b, which areas are larger compared to those of the first mounting land 4a and the second mounting land 4b, are arranged proximate to the first mounting land 4a and the second mounting land 4b apart from the first mounting land 4a and the second mounting land 4b to obtain a structure in which the contact probes 16a and 16b contact the first electric checker land 10a and the second electric checker land 10b instead of the first mounting land 4a and the second mounting land 4b. Thus, disconnections of the first circuit pattern 6a and the second circuit pattern 6b can be accurately detected by the automatic circuit pattern inspecting device even when positions of the first mounting land 4a and the second mounting land 4b are slightly deviated from normal positions due to manufacturing errors.

Further, in the printed circuit board 1A shown in FIG. 1, since the contact probes 16a and 16b do not pressure contact surfaces of the first mounting land 4a and the second mounting land 4b, no dents will be formed on surfaces of the first mounting land 4a and the second mounting land 4b, and there will be no worries of surface mounting failures of the chip part 100.

Example 2

The second example of the printed circuit board according to the present invention will now be described.

The second example of the printed circuit board according to the present invention is a printed circuit board mounted with a chip part that is smaller than the chip part 100 described in the first example.

Figure 4A:
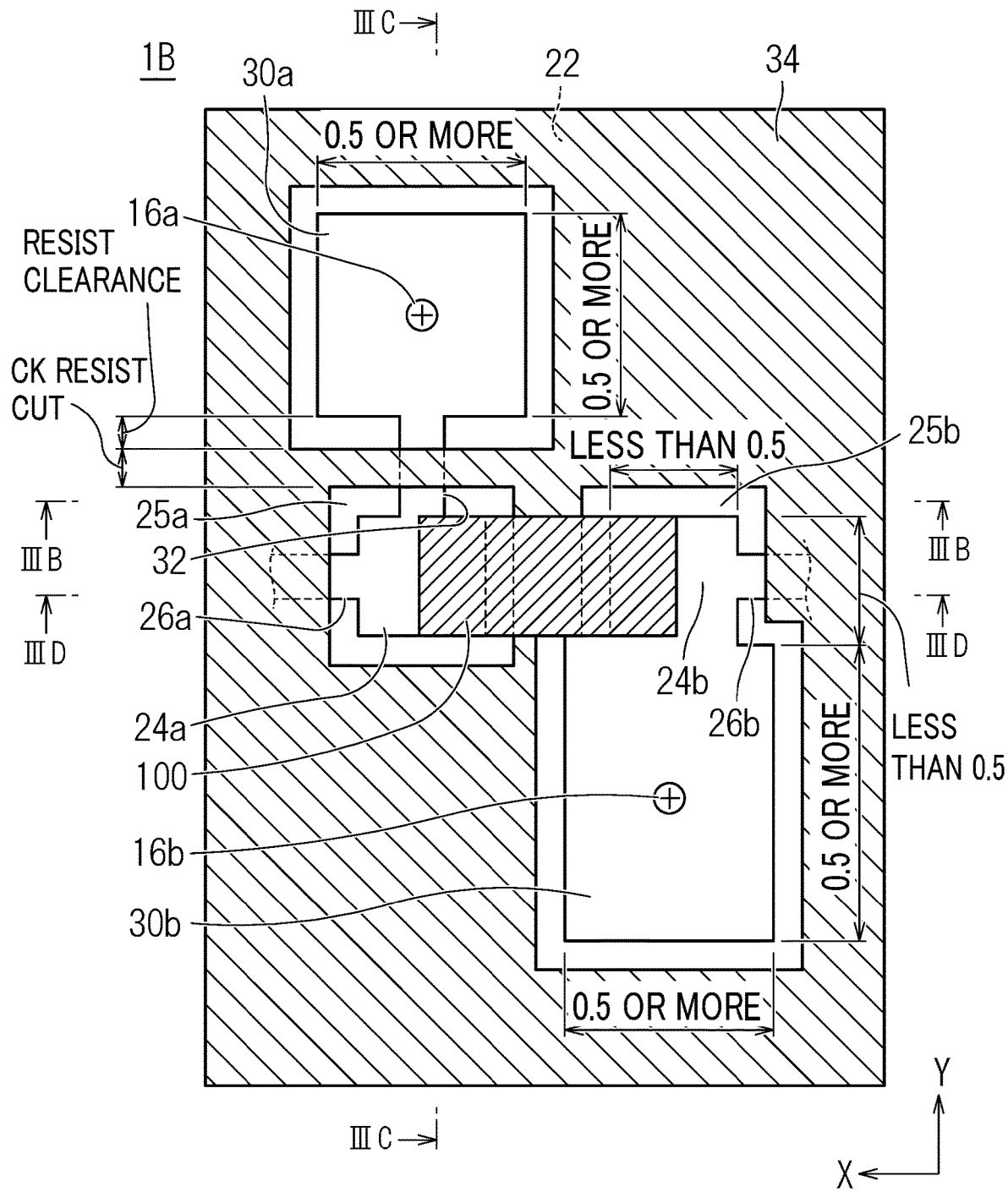
FIG. 4A is a plan view showing a second example of the printed circuit board according to the present invention.
Figure 4B:
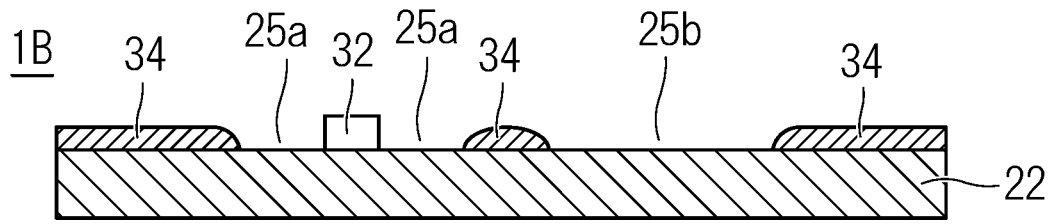
FIGS. 4B to 4D is an End view and cross sectional view of FIG. 4A
Figure 4C:
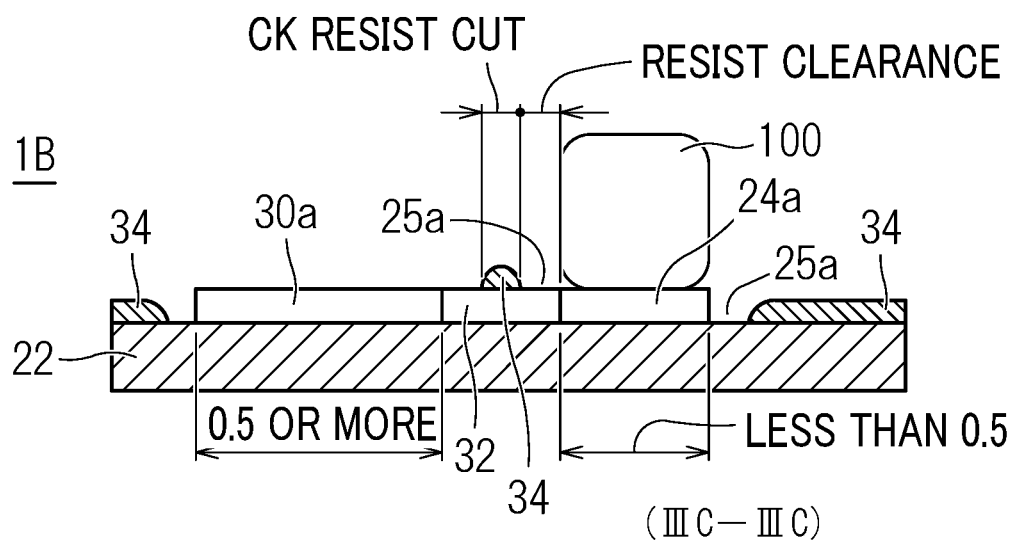
Figure 4D:
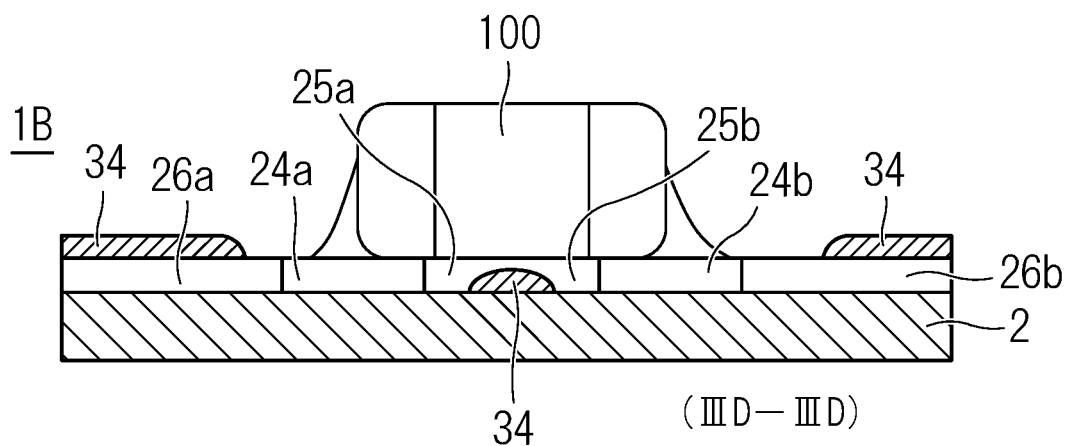
Figure 5:
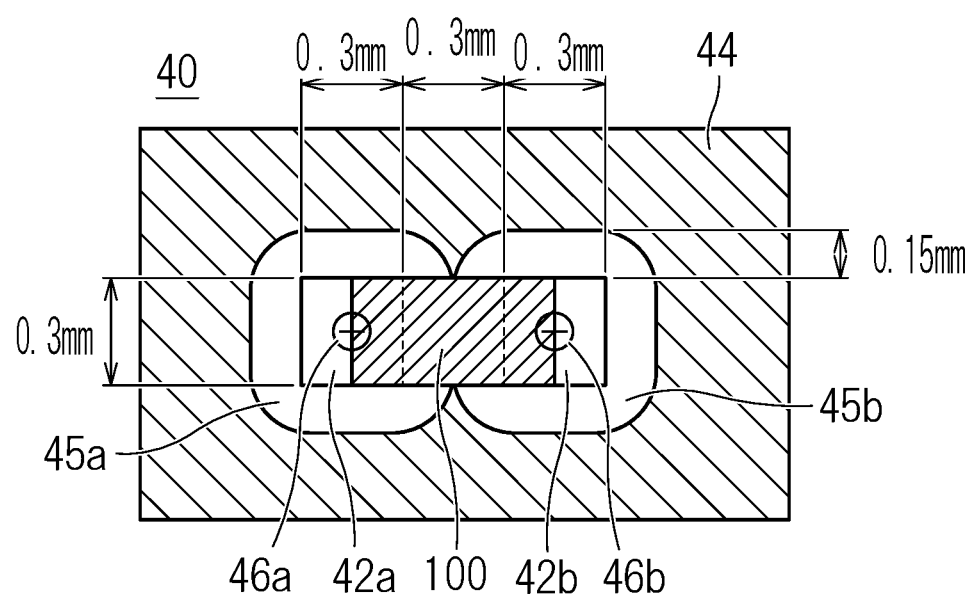
FIG. 5 is a plan view showing a general design standard of a chip part having a size standard of "0603".

As shown in FIG. 4A, in a printed circuit board 1B, a first mounting land 24a and a second mounting land 24b, a first circuit pattern 26a and a second circuit pattern 26b, a first electric checker land 30a and a second electric checker land 30b, a lead out pattern 32 and a solder resist film 34 are arranged on a surface of a wiring board 22.

The size of the mounting lands is less than 0.5 mm.

In this example, the first mounting land 24a and the second mounting land 24b are square or circular. Since the size standard of the chip part 100 to be mounted is "0603" and thus small, the land size is less than 0.5 mm square (more specifically 0.3 mm square) when the lands are square in a plan view, or the diameter of the lands is less than 0.5 mm (more specifically 0.3 mm) when the lands are circular in a plan view.

The patterns of the first mounting land 24a and the second mounting land 24b are disposed such that printing deviations are, for instance, within ±0.05 mm to 0.15 mm of the design positions.

The first mounting land 24a and the second mounting land 24b are disposed in parallel at an appropriate interval.

The solder resist film 34 to be described later is formed between the first mounting land 24a and the second mounting land 24b. A resist clearance 25a is formed between the solder resist film 34 and the first mounting land 24a as to enclose the first mounting land 24a. Further, a resist clearance 25b is formed between the solder resist film 34 and the second mounting land 24b as to enclose the second mounting land 24b.

The size of the electric checker lands is 0.5 mm or more.

In this example, the first electric checker land 30a and the second electric checker land 30b are rectangular. Further, the first electric checker land 30a and the second electric checker land 30b are respectively formed such that their areas are larger than those of the first mounting land 24a and the second mounting land 24b. More specifically, the first electric checker land 30a and the second electric checker land 30b are respectively set to be, for instance, at least 0.5 mm square or more. Since patterns of the first electric checker land 30a and the second electric checker land 30b are formed simultaneously with the patterns of the first mounting land 24a and the second mounting land 24b, printing deviations from design positions occur in the same direction and by the same amount as the first mounting land 24a and the second mounting land 24b. Accordingly, respective design positions of the patterns of the first electric checker land 30a and the second electric checker land 30b are disposed such that they are within ±0.05 mm to 0.15 mm of the design values.

The solder resist film 34 for protecting the first mounting land 24a and the second mounting land 24b, and the first electric checker land 30a and the second electric checker land 30b, among others, from, for instance, short-circuiting is formed with respect to the first mounting land 24a and the second mounting land 24b, among others, to have a deviation tolerance of, for instance, ±0.15 mm (that is, the resist clearances 25a and 25b are, for instance, within 0.15 mm).

The lead out pattern 32 for electrically connecting the first mounting land 24a with the first electric checker land 30a extends in the direction y towards the outside of the chip part 100. The second mounting land 24b and the second electric checker land 30b are connected directly with each other, wherein the second electric checker land 30b extends to the direction y in a direction opposite to the first electric checker land 30a towards the outside the chip part 100.

The length of the lead out pattern 32 is 0.45 mm or more and 0.6 mm or less based on cumulative results of manufacturing errors upon considering two patterns of manufacturing errors as shown in the above Table 1.

By this structure, the printed circuit board 1B can obtain the same effects as those of the printed circuit board 1A.

2. Method of Manufacturing a Printed Circuit Board

A method of manufacturing a printed circuit board of the above structure will now be described using the printed circuit board 1A of the first example as shown in FIG. 1.

First, a printed wiring board 2 is prepared, which is comprised of such as glass epoxy with a copper clad foil (hereinafter also referred to as "copper clad printed wiring board") being put on a main surface thereof. In order to simultaneously form the first mounting land 4a and the second mounting land 4b, the first circuit pattern 6a and the second circuit pattern 6b, the first electric checker land 10a and the second electric checker land 10b, the first lead out pattern 12a and the second lead out pattern 12b, among others, on the surface of the copper clad printed wiring board 2, an etching resist ink is applied in a shape of patterns using a screen printing method with such as polyester, stainless steel board, or polyarylate to be arranged for instance, within ±0.05 mm to 0.15 mm of the design positions.

The method of manufacturing a printed circuit board is to form patterns by means of a subtract method using a laminated plate that has a metal layer formed on the surface of the printed wiring board 2 formed of insulator, and employs a printing method of printing patterns using a screen printing plate, and removing the metal layer excluding the patterns through etching.

Figure 3:
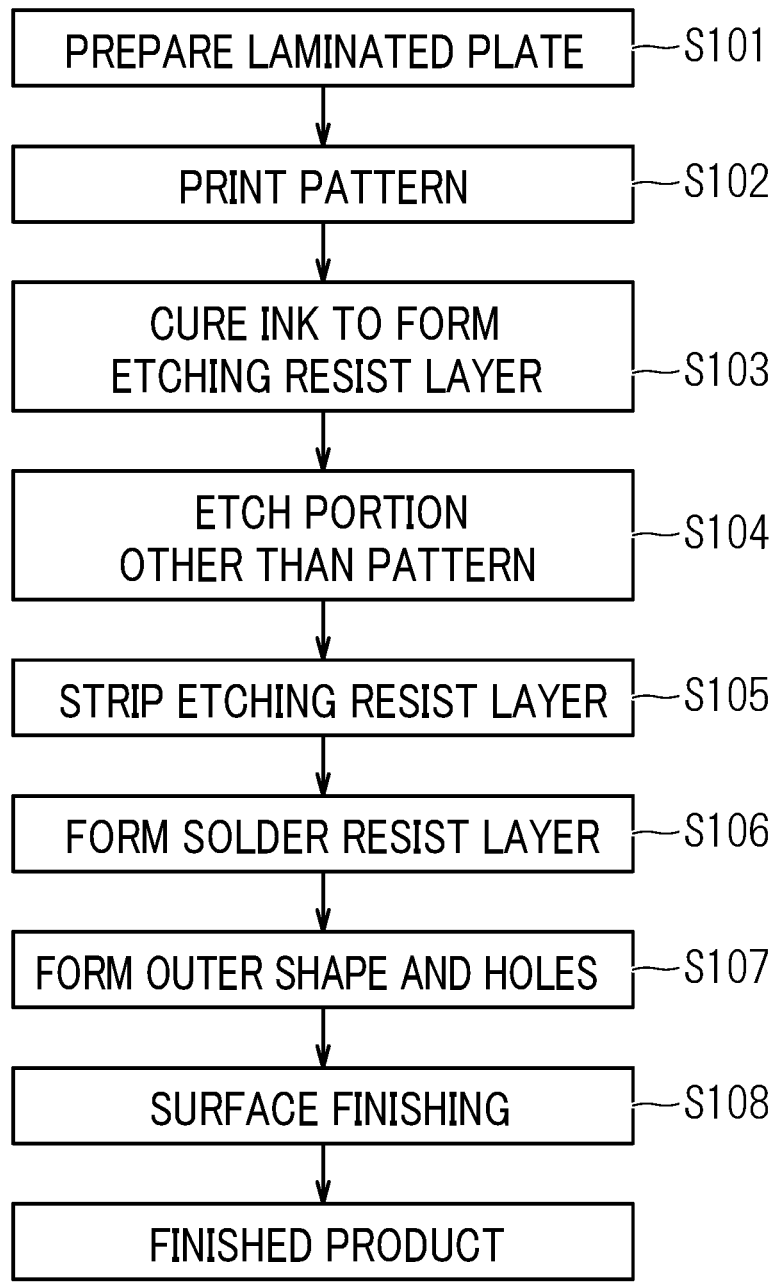
FIG. 3 is a flowchart for describing a method of manufacturing of the printed circuit board.

The method of manufacturing a printed circuit board by means of a screen printing method will now be described below while referring to the flowchart of FIG. 3.

First, a laminated plate obtained by forming a metal layer on the surface of the printed wiring board 2 formed of insulator is prepared (step S101).

Next, after performing pretreatment processes such as cleaning and roughness formation of the prepared laminated plate, the etching resist ink is printed onto the pattern parts of the metal layer of the laminated plate using a screen printing plate (etching resist ink printing step S102).

Thereafter, the etching resist ink is cured to form an etching resist layer (etching resist layer forming step S103)

Then, etching is performed to the metal layer of the laminated plate to remove unnecessary parts (parts excluding the patterns) (etching step S104).

Thereafter, the etching resist layer is stripped to remove the etching resist layer of the patterns (etching resist layer removing step S105).

That is, after drying of the etching resist ink, parts, which are not applied with the etching resist ink and where copper is exposed, are etched using etching liquid. The etching resist ink is removed thereafter to form the first mounting land 4a and the second mounting land 4b, the first circuit pattern 6a and the second circuit pattern 6b, the first electric checker land 10a and the second electric checker land 10b, the first lead out pattern 12a and the second lead out pattern 12b, among others, made of copper.

Then, solder resist printing is performed using solder resist ink in peripheral areas of the pattern parts not to be soldered (the first mounting land 4a and the second mounting land 4b, the first circuit pattern 6a and the second circuit pattern 6b, the first electric checker land 10a and the second electric checker land 10b, and the first lead out pattern 12a and the second lead out pattern 12b). Thereafter, the printed solder resist ink is cured to form a solder resist film 14 (solder resist layer forming step S106).

That is, the solder resist ink is applied in a shape of patterns by using a screen printing method such that resist clearances 5a, 5b of the first mounting land 4a and the second mounting land 4b are disposed to be, for instance, within ±0.15 mm of the design positions, and the solder resist film 14 is formed.

Finally, outline machining and drilling (outline machining and drilling step S107) and surface finishing (surface finishing step S108) is performed. The surface finishing aims to clean the surface of the metal layer, wherein degreasing and rust removal is performed using acid. In this manner, the printing circuit board 1A formed patterns on a base material is manufactured.

It should be noted that there are other pattern forming methods such as a photo printing method and a metal mask printing method. However, while the photo printing method is accurate, the problem is that it involves many operating steps and that it takes times for the manufacture. For instance, while it takes 7 seconds to make a print in the screen printing method, it takes as much as 30 seconds to make a print in the photo printing method. Accordingly, screen printing is suitable for mass production. When the metal mask printing method is performed, costs of a metal mask are five to eight times higher than a screen in screen printing.

In the above described manner, the printed circuit board 1A having the first mounting land 4a and the second mounting land 4b; and the first electric checker land 10a and the second electric checker land 10b is manufactured.

As described so far, while examples of the present invention have been disclosed in the preceding descriptions, the present invention is not limited to the above.

In other words, the present invention can be variously modified without deviating from the technical idea and the scope of the purpose of the present invention for the described examples such as mechanism, shape, material, quantity, position and layout. Such modifications are included in the present invention.

For instance, the shape of the electric checker lands is freely selected such as circular, rectangular, triangular, or oval. Circular shapes are especially preferable to form easily in manufacturing.

REFERENCE SIGNS LIST 1A, 1B Printed circuit board
2, 22 Wiring board
4a, 24a First mounting land
4b, 24b Second mounting land
14, 34 Solder resist film
5a, 5b, 25a, 25b Resist clearance
6a, 26a First circuit pattern
6b, 26b Second circuit pattern
10a, 30a First electric checker land
10b, 30b Second electric checker land
12a First lead out pattern
12b Second lead out pattern
Lead out pattern
100 Chip part
x Direction a pair of mounting lands face each other
y Direction orthogonal to direction x

The invention claimed is:

1. A printed circuit board comprising:
   a wiring board;
   first and second mounting lands facing each other in a first direction on a surface of the wiring board for mounting a chip part therebetween;
   first and second circuit patterns provided on the surface of the wiring board and being electrically connected to the first and second mounting lands; and
   first and second checker lands for inspecting disconnection in the first and second circuit patterns, the first and second checker lands being provided on the surface of the wiring board and respectively electrically connected to the first and second mounting lands, the first and second checker lands respectively facing the first and second mounting lands in a second direction orthogonal to the first direction.

2. The printed circuit board as claimed in claim 1, wherein the first and second mounting lands each have a width in the first direction less than 0.5 mm.

3. The printed circuit board as claimed in claim 1, wherein the first and second checker lands each have a width in the second direction of 0.5 mm or more.

4. The printed circuit board as claimed in claim 1, further comprising a solder resist film formed on the surface of the printed wiring board excluding the first and second mounting lands and peripheral portions thereof, and the first and second checker lands and peripheral portions thereof.

5. The printed circuit board as claimed in claim 4, wherein resist clearances between the first mounting land and the solder resist film and between the second mounting land and the solder resist film are each 0.15 mm or more in design value.

6. The printed circuit board as claimed in claim 1, wherein ck resist cuts between the first mounting land and the first checker land and between the second mounting land and the second checker land are each 0.15 mm in design value.

7. The printed circuit board as claimed in claim 1, further comprising first and second lead-out patterns respectively extending in the second direction to respectively connect the first and second mounting lands to the first and second checker lands, wherein a length of the first and second lead-out patterns are each 0.45 mm or more.

8. The printed circuit board as claimed in claim 1, wherein the first and second checker lands extend towards an outer periphery of the printed circuit board.

9. The printed circuit board as claimed in claim 1, wherein the first and second checker lands each have a circular or rectangular shape.

10. The printed circuit board as claimed in claim 1, further comprising first and second lead-out patterns respectively extending in the second direction to respectively connect the first and second mounting lands to the first and second checker lands,
    wherein the first and second checker lands respectively face the first and second mounting lands from the same side of the first and second mounting lands.

11. The printed circuit board as claimed in claim 1, further comprising first and second lead-out patterns respectively extending in the second direction to respectively connect the first and second mounting lands to the first and second checker lands,
    wherein the first and second checker lands respectively face the first and second mounting lands from respective ones of opposite sides of the first and second mounting lands.

12. The printed circuit board as claimed in claim 1, further comprising a lead-out pattern extending in the second direction to connect the first mounting land to the first checker land,
    wherein the second mounting land is directly connected to the second checker land.

* * * * *